United States Patent [19]

Suss

[11] 4,136,459

[45] Jan. 30, 1979

[54] PARALLELIZING GAUGE IN A WEDGE ERROR CORRECTION HEAD

[75] Inventor: Winfried Suss, Unterhaching, Fed. Rep. of Germany

[73] Assignee: Karl Suss KG, Garching, Fed. Rep. of Germany

[21] Appl. No.: 761,431

[22] Filed: Jan. 21, 1977

[30] Foreign Application Priority Data

Feb. 25, 1976 [DE] Fed. Rep. of Germany ....... 2607607

[51] Int. Cl.$^2$ ............................................. G03B 27/02
[52] U.S. Cl. .................................... 33/180 R; 355/79
[58] Field of Search ...................... 33/180 R, 174 R; 269/105, 239, 21, 196-198, 217, 229; 355/73, 78, 95, 53, 54

[56] References Cited

U.S. PATENT DOCUMENTS

| 1,411,351 | 4/1922 | Hart | 269/229 |
|---|---|---|---|
| 1,818,167 | 8/1931 | Sears et al. | 269/217 |
| 2,906,205 | 10/1959 | Furman et al. | 269/229 |
| 3,858,978 | 1/1975 | Johannsmeier | 355/95 |
| 3,988,865 | 11/1976 | Weisman | 269/196 |

Primary Examiner—Richard E. Aegerter
Assistant Examiner—Willis Little
Attorney, Agent, or Firm—Orrin M. Haugen

[57] ABSTRACT

A parallelizing gauge in a wedge error correction head for the parallel adjustment of a substrate plate to the plane of a light exposing mask, with a means being provided for introducing and removing substrate plates and masks into and/or out of the intermediate space between the light source and the substrate support. At least three foil segments are provided, each being distributed over the circumference of the wedge error correction head and extending radially inwardly, and each being controllably movable in a radial direction.

4 Claims, 3 Drawing Figures

PARALLELIZING GAUGE IN A WEDGE ERROR CORRECTION HEAD

BACKGROUND OF THE INVENTION

Used in increasing measure for the production of electronic circuits are substrate plates made of ceramic materials, glass, or of semiconductor materials, which are provided with circuit patterns lying in superimposed relationship one over the other in one or several layers. This requires one or several light exposure procedures in which the substrate plate is, each time, illuminated through a mask whose pattern corresponds to the desired circuit pattern in the plane concerned. A basic assumption for the production of a satisfactory, sharply illuminated pattern on the substrate plate is an exactly plane-parallel adjustment of the substrate plate relative to the light or illumination exposing mask prior to exposure. In an older state of the art, this occurred by moving the substrate plate, while arranged on the wedge error correction head, close to the light exposing mask up to the point of full surface contact between substrate plate and exposing mask. Accordingly, the desired plane-parallel adjustment results in positive fashion. With this adjustment, illumination took place either at the same time, or the adjustment of the wedge error correction head was fixed in the contacting position of substrate plate and light exposing mask, and thereafter the wedge error correction head was moved a slight distance away relative to the light exposing mask, and the calibration of the pattern on the light exposing mask to the pattern on the substrate plate was carried out from this remote position. Illumination occurred after the contact between mask and substrate was re-established.

However, since the surface of the substrate brought into contact with the light exposing mask is not at all smooth, displaying rather a very high degree of microroughness, the light exposing mask is somewhat degraded or marred with each parallelizing procedure, so that the relatively expensive light exposing mask had to be replaced after about 40 illuminating procedures.

The present invention emanates from a more developed state of the art ("Micro Electronics", Volume 6, No. 4, 1975, pages 51-59), where, for parallelizing, the substrate plate need no longer be brought into surface contact with the light exposing mask. Moreover, for parallelizing of substrate plate and light exposing mask, there is introduced between these two elements a disk-shaped parallelizing gauge with a rim bead running about it that displays a very constant axial thickness and projects out to both sides, in the axial direction, over the enclosed disk surface. By moving the substrate plate closer to the light exposing mask, there now results a placement, each in turn, of one outer circumferential area of the substrate plate and of the light exposing mask against the oppositely facing front surfaces of the rim bead of the parallelizing gauge. This makes possible a satisfactory plane-parallel adjustment of the substrate plate relative to the light exposing mask, without having the two elements touching each other (except for a negligibly narrow rim area which is of no consequence). However, in order for it to be able to be pushed, via a slide, between the substrate plate and the light exposing mask without drooping and without scraping, the disk-shaped parallelizing gauge must display a considerable thickness that is essentially greater than that interval between substrate plate and light exposing mask, that is still just permissible, during the illuminating procedure (with too great an interval between substrate plate and light exposing mask, fuzzy or non-sharp illuminations result). Consequently, after parallel adjustment of substrate plate and light exposing mask, the substrate plate must be moved sufficiently far away from the light exposing mask, by appropriate axial movement of the wedge error correction head, in order that the parallelizing gauge can be withdrawn without damaging the side surfaces of substrate plate and light exposing mask, whereafter the substrate plate must again be moved close to the light exposing mask, up to the small distance required for illuminating. However, the axial movements of the wedge error correction head required for this can be carried out only at a relatively slow speed, since, in each case, impingement of the substrate plate on the light exposing mask must be avoided. These slow speeds in turn occasion a very important expenditure of time.

SUMMARY OF THE INVENTION

The task for the present invention is obtaining, relative to the state of the art, an improved parallelizing gauge that requires only very short axial movements of the wedge error correction head between the parallel adjustment and the illuminating setting. This is achieved by the use of at least three foil segments distributed over the circumference of the wedge error correction head, each running radially inwardly, and each of which is movable in a radial direction.

Achieved by the idea of the present invention is that the foil segments can be kept short and can consist of a very thin material, with the thickness of the material being within the range of the desired interval between substrate plate and light exposing mask during the illumination procedure, i.e., therefore, in the range from between 10 to 200 microns. It requires an essentially small expenditure of time, after making the parallel adjustment, to guide the relatively short, radially inward running foil segments out of the gap between substrate plate and light exposing mask, which occasions a first time savings. A second time savings results from the fact that the short foil segments droop practically not at all, so that to move the foil segments of the wedge error correction head out with the substrate plate requires execution of only a relatively very short axial rearward movement relative to the light exposing mask. A third time savings results from the fact that, to achieve the illumination setting, only the axial rearward movement of the wedge error correction head described in the foregoing needs to again be compensated, since, upon reaching that interval between substrate plate and light exposing mask that was present at the time of parallel setting, with foil segments introduced, illumination can also be undertaken. A fourth time savings results from the fact that, in any event with the first illumination of the substrate plate, the illumination procedure can follow immediately after having carried out the parallel adjustment, at which time the foil segments are located between the substrate plate and the light exposing mask, without it being necessary that there be a retraction movement of the wedge error correction head out of this gap, along with corresponding axial movements.

The further development of an object of the present invention yields an especially favorable actuating contrivance for the foil segments serving as a parallelizing gauge, with small structural dimensions, particularly in the radial direction.

The further development of an object of the present invention yields a favorable, space-saving actuating contrivance that operates simultaneously on all foil elements. These features will be described more fully hereinafter.

The further development of an object of the present invention makes possible a simple substitution of the foil segments forming the parallelizing gauge, whether for the purpose of replacement due to damages, or for the purpose of adaptation to different, desired illumination intervals between substrate plate and light exposing mask.

IN THE DRAWING

The invention is explained further in the following, with reference to the drawing, in which there is shown:

FIG. 1, an example of embodiment of a wedge error correction head containing a parallelizing gauge in accordance with the invention whose top portion, along with a support for a substrate plate, is shown in detail in the axial crosssection, with its lower portion shown only schematically, together with a light exposing mask associated with the wedge error correction head, along with a mask holder, whereby component parts of the foil segments forming the parallelizing gauge in accordance with the invention are illustrated in the swung-out position;

FIG. 2, a cut along line II—II of FIG. 1; and

FIG. 3, as compared to FIG. 1, a strongly schematicized representation for illustrating a swung-in position of the component parts of the foil segments forming the parallelizing gauge between the light exposing mask and a substrate plate.

DESCRIPTION OF THE PREFERRED EMBODIMENT

Figure 1:
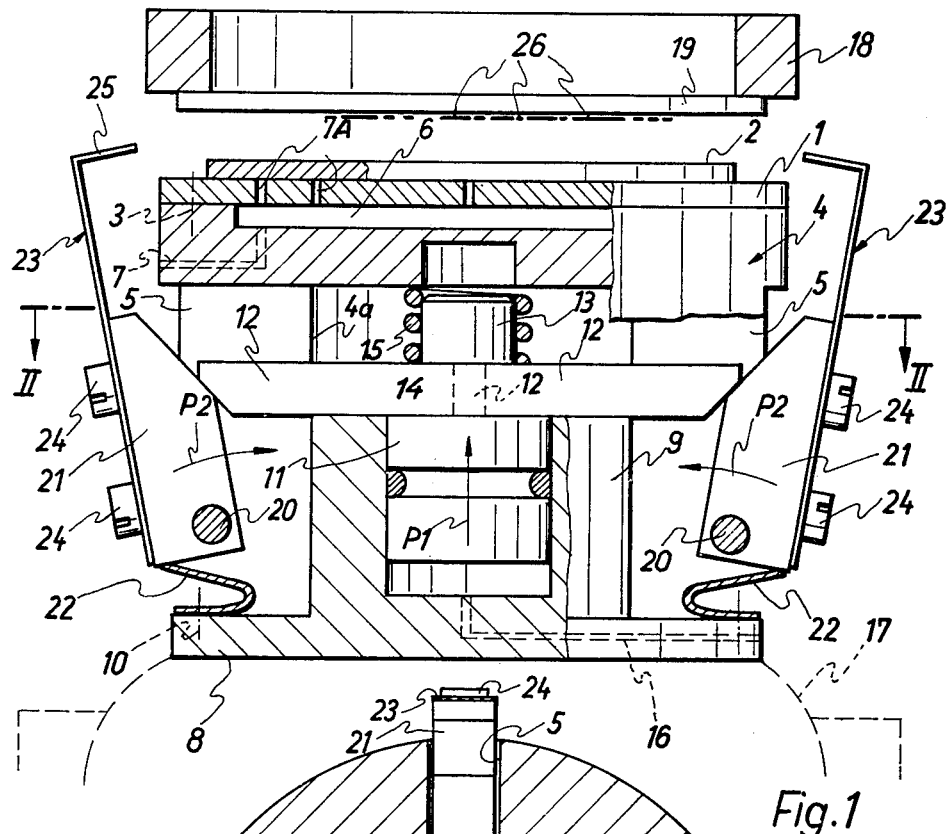
Figure 2:
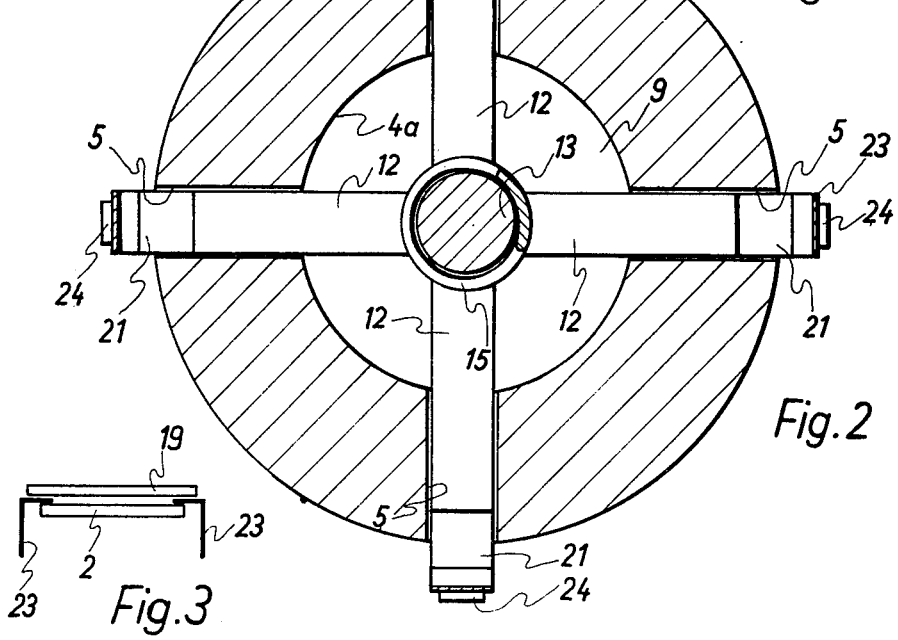

The wedge error correction head illustrated in FIG. 1 includes a substrate support 1 for a cruciform substrate plate 2. However, it is evident that, with appropriate design of substrate support 1, square or rectangular substrate plates 2 also can be illuminated. Substrate support 1 is joined, through means of several countersunk screws 3 (of which, only a single one is shown by a broken line in FIG. 1), with a cylindrical lower supporting member or section 4 that displays a central boring 4a having an essentially smaller diameter, when compared to the outer diameter of the lower supporting section 4. In the axially extending region of boring 4a, the lower supporting section 4 is provided with four radial slots 5 equally distributed over the circumference. The upper front face of the lower display section 4 is provided with a flat cylindrical cutout 6 that is to be acted upon selectively by vacuum or compressed air, via a supply line 7. The substrate support 1 displays a group of nozzles 7a distributed over the surface, in order, after overlaying a substrate plate 2, to guarantee a satisfactory deposit by means of acting upon it with vacuum, and after the completed illuminating procedure to guarantee a slight lifting with compressed air, at a slightly positive pressure.

Introduced into the central boring 4a of the lower supporting section 4 is a positioning cylinder 9 provided with a flange 8, whose axial length is less than that of boring 4a. Flange 8 is joined with the lower front face of the lower supporting section through means of several screws 10, shown by a broken line, distributed evenly over the circumference. The positioning cylinder 9 serves for accepting a positioning piston 11, centrally introduced in the correction head, which carries, on its upper surface, a group of four displacement cams 12 extending radially outwardly. Provided on displacement cams 12, as well as, in some cases, with positioning piston 11 structured in one piece with this latter, is a guide piston 13 that is destined to enter into a coaxial, cylindrical guide recess 14 on the lower internal front face of the lower supporting section 4 upon upward movement of positioning piston 11, in the direction of an arrow P1, out from the basic position shown in FIG. 1. The positioning piston 11, along with the displacement cams 12, is biased in the basic position illustrated in FIG. 1 through means of a return spring 15. The positioning piston 11 can be acted upon on its lower surface by compressed air via a feed line 16 that runs in flange 8 of positioning cylinder 9.

Flange 8 is a component part of a ball joint 17, indicated merely by a broken line, which makes it possible for the substrate support 1 that is rigidly joined to it, as well as the lower supporting section 4, to make tilting movements in relation to a light exposing mask 19 held in a mask holder 18. Instead of ball joint 17, a number of other joint constructions can also be used, in particular a Cardan bearing. The structuring of joint 17 does not represent any part of the invention, nor does an associated attachment contrivance (not shown) for locking joint 17 after a parallel adjustment has been made between the substrate plate 2 and the light exposing mask 19. Provided below joint 17 is a vertical stroke contrivance (not shown) which makes possible an axial rapprochement of the substrate support 1, along with substrate plate 2 lying upon it, toward and away from, respectively, the light exposing mask 19.

Arranged in the lower portion of each of radial slots 5, directed perpendicularly to each displacement cam 12 respectively, running tangentially to the plane of the correction head and, respectively, the plane of the substrate support 1, is a pivot axle 20. Each pivot axle bearingly supports an associated hinged arm 21 that is biased radially inwardly, in the direction of the arrow P2, by means of a leaf spring 22. All hinge arms 21 therefore rest with their corresponding diagonal surfaces against the displacement cams 12 in each position of positioning piston 11.

Attached to the outside surface of each hinge arm 21 is an L-shaped strip of foil 23, fastened at its longer branch by means of screws 24. The shorter branch of each strip of foil 23 is directed radially inwardly toward the center of the correction head and forms a foil segment 25. The thickness of foil strips 23 lies in the range of from 10 to 200 microns and corresponds preferably to the open interval between the adjacently lying surfaces of substrate plate 2 as well as the light exposing mask 19 during an illuminating procedure. As a minimum, the thickness of foil segment 25 is to be selected such that a pattern 26, which is made of a material susceptible to scratching, located on the surface of light exposing mask 19, will not be degraded or damaged by the possible presence of upwardly extending surface projections of substrate plate 2.

Figure 3:
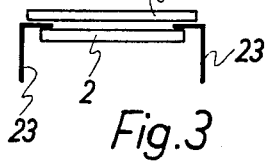

To carry out an illumination on a substrate plate 2, starting from the operating position shown in FIG. 1, the positioning piston 11 is acted upon by compressed air, whereby the displacement cams 12 are moved upwardly. Because of the biasing of leaf spring 22, each hinge arm 21, while maintaining the contact against displacement cams 12, is pressed radially inwardly until foil segments 25 cover over the gap between the light exposing mask 19 and the substrate plate 2. Then, with joint 17 not being locked, the entire wedge error correction head is moved axially upwardly until the substrate plate 2 impinges, via foil segment 25, against the light exposing mask. This position is illustrated schematically in FIG. 3. Since the foil segments 25 display constant thickness, a precise optically parallel adjustment is brought about, in this manner, between the substrate plate 2 and the light exposing mask 19. Now, the joint 17 can be locked.

The further course of the operational procedure depends upon whether a first illumination or a follow-up illumination is to be carried out. If a first illumination is to be carried out, it is advantageous to select the thickness of the foil segments such that the interval defined by foil segments 25 between the light exposing mask 19 and the substrate plate 2 corresponds to that for a favorable remote illuminating interval in the previously mentioned range from 10 to 200 microns. The fact that the foil segments 25 cover over certain edge areas of substrate plate 2 is insignificant, since these edge areas cannot be used anyhow in later processing of the substrate plate and are normally broken off. If, however, the thickness of the foil segments 25 does not correspond to the desired interval for remote illumination of the substrate plate 2, then, after locking the joint 17, the entire wedge error correction head is slightly lowered relative to the light exposing mask. Next, the actuation of positioning piston 11 by compressed air is stopped, whereupon, under the effort of return spring 15, the displacement cams 12, with positioning piston 11, are pushed downwardly in the direction opposite to that of arrow P1 and, in this manner, the hinge arms swing radially outwardly, in the direction opposite to that of arrow P2, until the basic position of FIG. 1 is reached. Then, releasing the locking means of joint 17, the wedge error correction head can again be moved axially closer to the light exposing mask until the desired open interval between the substrate plate 2 as well as light exposing mask 19 is obtained.

I claim:

1. A parallelizing gauge for maintaining a predetermined parallel spacing between a light exposure mask and a substrate plate comprising, in combination:
   (a) means for holding a flat light exposing mask in a predetermined plane;
   (b) a substrate supporting member having a surface disposed in a generally parallel, spaced apart relationship with respect to said predetermined plane;
   (c) positioning means coupled to said substrate supporting member for selectively moving said substrate supporting means toward and away from said light exposing mask; and
   (d) at least three spacer members operatively coupled to said substrate supporting member and movable relative thereto, means for automatically moving said spacer members radially inwardly into the space between said substrate supporting member and light exposing mask at different points around the periphery of said substrate supporting member in response to the movement of said substrate supporting member towards said light exposing mask, the radial motion of said spacer members being small with respect to the dimensions of the substrate plate, and as said substrate supporting member is withdrawn from said light exposing mask, said means for moving said spacer member further causing said members to be retracted radially outwardly from the space therebetween.

2. Apparatus as in claim 1 wherein said substrate supporting member comprises a cylinder disposed in its lower portion, a piston disposed within said cylinder and having one end thereof adapted to engage said spacer members when a fluid is introduced into said cylinder.

3. Apparatus as in claim 1 wherein a bracket is pivotally coupled to each of said spacer members, and wherein:
   (a) said bracket being pivotally coupled to the lower portion of said supporting member and having a cam follower surface on a predetermined portion thereof; and
   (b) a generally L-shaped foil element having one branch thereof attached to said bracket and the other branch thereof forming the said spacer element and extending inwardly toward the space between said light exposing mask and said substrate supporting member.

4. A parallelizing gauge for maintaining a predetermined parallel spacing between a light exposure mask and a substrate plate comprising, in combination:
   (a) means for holding a flat light exposing mask in a predetermined plane;
   (b) a substrate supporting member having a surface disposed in a generally parallel, spaced apart relationship with respect to said predetermined plane;
   (c) positioning means coupled to said substrate supporting member for selectively moving said substrate supporting means toward and away from said light exposing mask, said positioning means comprising a cylinder, a piston disposed in said cylinder and having one end thereof adapted to engage said substrate supporting member when a fluid is introduced into said cylinder;
   (d) at least three spacer members operatively coupled to said positioning means, and with cams attached to said piston for reciprocal motion therewith and having a surface thereof engaging said cam follower surface on each of said spacer members;
   (e) a bias spring disposed between said base plate and said bracket for urging the cam follower surfaces of said brackets against said cam surface;
   (f) the arrangement being such that as said spacer members are moved into the space between said substrate supporting member and said light exposing mask at different points around the periphery of said substrate supporting member, and as said substrate supporting member is withdrawn away from said light exposing mask, said spacer members are retracted from the space therebetween.

* * * * *